(12) United States Patent
Kokorin

(10) Patent No.: US 11,609,593 B1
(45) Date of Patent: Mar. 21, 2023

(54) FAST LCR METER WITH LEAKAGE COMPENSATION

(71) Applicant: Oleksandr Kokorin, Sunnyvale, CA (US)

(72) Inventor: Oleksandr Kokorin, Sunnyvale, CA (US)

(*) Notice: Subject to any disclaimer, the term of this patent is extended or adjusted under 35 U.S.C. 154(b) by 0 days.

(21) Appl. No.: 17/712,068

(22) Filed: Apr. 2, 2022

(51) Int. Cl.
G01R 35/00 (2006.01)
G05F 5/00 (2006.01)

(52) U.S. Cl.
CPC ............. G05F 5/00 (2013.01); G01R 35/005 (2013.01)

(58) Field of Classification Search
CPC ................................ G05F 5/00; G01R 35/005
USPC ........................................................ 324/601
See application file for complete search history.

(56) References Cited

U.S. PATENT DOCUMENTS

| | | | |
|---|---|---|---|
| 6,028,309 A * | 2/2000 | Parrish | H04N 5/3655 250/252.1 |
| 7,616,008 B1 | 11/2009 | Rayman et al. | |
| 8,547,135 B1 * | 10/2013 | Yarlagadda | H03K 19/177 326/38 |
| 9,910,074 B2 | 3/2018 | Lindell et al. | |
| 10,013,015 B2 | 7/2018 | Ida et al. | |
| 2014/0348502 A1 * | 11/2014 | Miura | H04B 10/572 398/34 |
| 2020/0135441 A1 * | 4/2020 | Jones | H03F 1/34 |
| 2021/0333348 A1 * | 10/2021 | Fortney | G01R 35/005 |

FOREIGN PATENT DOCUMENTS

CN 110320410 A 10/2019

OTHER PUBLICATIONS

Zhang et al. A Novel Fast Balance Technique for the Digital AC Bridge (Apr. 1998).
A History of Impedance Measurements by Henry P. Hall.
Keysight E4980A Precision LCR Meter Datasheet (2021).
Keysight Impedance Measurement Handbook 6th Ed (2021).

* cited by examiner

Primary Examiner — Tung X Nguyen
Assistant Examiner — Robert P Alejnikov, Jr.

(57) ABSTRACT

An LCR meter with a fast balancing method, with only one necessary measurement of voltages. The LCR meter uses to speed up balancing, separation in time measurement of a device under test (DUT), and other parasitic impedances, including a leakage impedance. The leakage impedance and the other parasitic impedances of a fixture and the LCR meter itself are measured during open/short calibration and saved to memory. The DUT is measured during measurement using already known parasitic impedances. This allows calculating balancing conditions using only one measurement of voltages.

1 Claim, 6 Drawing Sheets

FAST LCR METER WITH LEAKAGE COMPENSATION

BACKGROUND

| U.S. Patents | | | |
|---|---|---|---|
| Pat. No. | Kind Code | Issue Date | Patentee |
| 10,013,015 | B2 | Jul. 3, 2018 | Ida et al. |
| 9,910,074 | | Mar. 6, 2018 | Lindell et al. |
| 7,616,008 | | Oct. 11, 2019 | Rayman et al |

| Foreign Patent Documents | | | |
|---|---|---|---|
| Foreign Doc. | Country Code | Publication Date | Patentee |
| 110320410A | CN | Oct. 11, 2019 | Fajie et al. |

Nonpatent Literature Documents

Zhang et al. A Novel Fast Balance Technique for the Digital AC Bridge (April 1998)
A History of Impedance Measurements by Henry P. Hall
Keysight E4980A Precision LCR Meter Datasheet (2021)
Keysight Impedance Measurement Handbook 6th Ed (2021)

The main parameters of an LCR meter are accuracy and speed of measurements. The rate of measurements is essential if the LCR meter is used as part of an impedance analyzer or in production.

The impedance measurement is based on measuring voltage drops across a range resistor with known impedance and a device under test (DUT) placed in series. The impedance of the DUT is calculated by knowing the current through and voltage drop of the DUT.

In this case, the leading cause of an error (FIG. 1) is a leakage current through a leakage impedance between a middle point of the DUT and the range resistor to the ground. The leakage current is the reason for the non-equality of the currents through the range resistor and the DUT.

To decrease the leakage current, different methods are used.

One of them is a guard method, which helps to decrease voltage between the middle point and the shield in a cable to the DUT from the LCR meter's low potential (LP) terminal to the DUT by applying a voltage to the guard through a voltage follower. This method is used in Digital Impedance Meter ESI Model 251 "A History of Impedance Measurements by Henry P. Hall " p.49.

Another method is an auto-balancing bridge by the transimpedance amplifier (TIA). This method is used in the Digital Impedance Meter GR Type 1685-A "A History of Impedance Measurements by Henry P. Hall" p.49.

Both these methods have instant action for balancing, but they have a low gain at high frequencies and, therefore, low common voltage suppression between the middle point and the shield of the cable. Also, they may have stability problems.

LCR meters with modem-type auto-balancing bridges have good balancing accuracy at high frequencies, as in Hewlett Packard 4271A LCR meter "A History of Impedance Measurements by Henry P. Hall" p.49. But they include low-speed integrators that need a few periods of signal frequency for settling time and, for this reason, take long measurement time at low and medium frequencies. Also, they are expensive. A digital version of modem-type auto-balancing bridge exists in U.S. Pat. No. 7,616,008 B1 Rayman et al. (2009) but has the same flaw as the analog version, low speed at low and medium frequencies.

Some other digital methods exist, like in U.S. Pat. No. 10,013,015 B2 Ida et al. (2018), CN110320410A Fajie et al. (2019), "A Novel Fast Balance Technique for the Digital AC Bridge" Zhang et al. (1998). But all of them need at least two voltage measurements and at least two periods of signal frequency for balancing.

SUMMARY OF THE INVENTION

The present invention is a digital LCR meter with a fast-balancing method containing a few components to get high accuracy and a high measurement rate.

First, it is the separation in time of measurement of a DUT and other necessary for fast-balancing parameters. Such parameters are the leakage impedance of the fixture and LCR meter and series impedances of the fixture and voltage sources. These parameters are constant and may be measured only once during calibration and later used on the DUT measurement time.

Second, it measures a DUT impedance without balance conditions with moderate accuracy. In this case, a leakage current causing measurement error is compensated by the calculated value of this current using unbalanced voltage and a previously measured value of the leakage impedance.

Third, the moderate accuracy value of the DUT and previously measured series impedances of the fixture and voltage sources allow calculating and setting in one step, without any iterations, voltages of voltage sources to get the balancing conditions, close to zero voltage in the middle point between the DUT and a range resistor. The balancing conditions allow measuring the DUT impedance with high accuracy. With modern high-speed processors, it does not increase measurement time.

Figure 1:
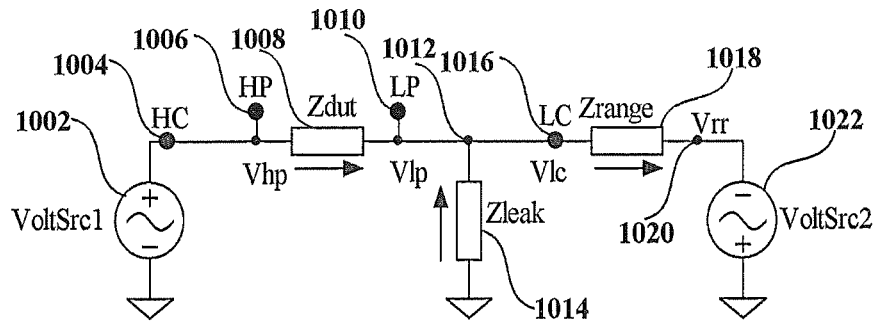
FIG. 1 shows the leading cause of inaccuracy in LCR meters.

REFERENCE NUMERALS 1002 first voltage source (VoltSrc1).
1004 high current terminal (HC).
1006 high potential terminal (HP).
1008 device under test (DUT).
1010 low potential terminal (LP).
1012 middle point between the device under test and the range resistor.
1014 leakage impedance (Zleak).
1016 low current terminal (LC).
1018 range resistor (Zrange).
1020 voltage on the second terminal of the range resistor (Vrr).
1022 second voltage source (VoltSrc2).
3002 output impedance of the first voltage source (Zout1).
3004 impedance of series current limiting resistor (Zser_res).
3006 output impedance of the first voltage source's buffer (Zbuff1).
3008 impedance of cable wire between the high potential terminal and the device under test (Zwire1).
3010 capacitance of cable between the high potential terminal and the device under test (Ccable1).
3012 impedance of cable wire between the DUT and low current terminal (Zwire2).
3014 parasitic capacitance of range resistor multiplexer (Cmux).
3016 impedance of range resistor multiplexer (Zmux).
3018 output impedance of the second voltage source (Zout2).
3020 output impedance of second voltage source buffer (Zbuff2).
9004 switch for calibration high potential buffer.
9006 switch for calibration low potential buffer.
9008 switch for calibration low current buffer.
9010 switch for calibration range resistor buffer.
9012 switch for providing calibration voltage to input buffers.
9016 high potential voltage input buffer.
9018 low potential voltage input buffer.
9020 low current voltage input buffer.
9022 range resistor voltage input buffer.
9024 first voltage source output buffer.
9026 second voltage source output buffer.
9028 first low pass filter (LPF1).
9030 input multiplexer.
9032 output multiplexer buffer.
9033 multiplexer control interface.
9034 second low pass filter (LPF2).
9036 first digital-to-analog converter (DAC) (DAC1).
9038 first analog-to-digital converter (ADC) (ADC1).
9040 second DAC (DAC2).
9042 digital signal to the first DAC.
9044 digital signal from the first ADC.
9046 digital signal to the second DAC.
9048 processor.
10002 second ADC (ADC2).
10004 third ADC (ADC3).
10006 fourth ADC (ADC4).
11002 first set of memory buffers.
11004 second set of memory buffers.
11006 direct Fourier transform (DFT) block.
11008 cosine multiplier.
11010 sine multiplier.
11012 demultiplexer and accumulators.
11014 software direct digital synthesizer (DDS).
11016 controlling and processing core.
12002 common direct memory access (DMA) flowchart.
12004 direct Fourier transform (DFT) processing for ADC data flowchart.
12006 DMA data preparation for DAC and reference buffers flowchart.

DETAILED DESCRIPTION

To increase the accuracy of measurements, the prior art only eliminates or decreases voltage dropping on the leakage impedance.

Also, the prior art, excluding the guard and trans-impedance auto-balancing methods, needs at least two measurements to reach balancing because measurement circuitry has at least two significant unknown parameters, the impedance of the device under test and the leakage impedance. But according to math science, two unknowns are needed in at least two equations and, therefore, two sets of measured voltages.

The leakage impedance and other parasitic parameters of the used fixture and the LCR meter are constant and can be measured once during calibration. This information can then be applied automatically to save the time of measuring. Also, their influence may be compensated in the DUT impedance calculated result if their values are known.

The present invention uses preliminary measuring of the leakage impedance and the series impedances of fixture and voltage sources during calibration to increase accuracy and speed up measurements. The knowledge of parasitic impedances allows more accurate and fast measurements. The parasitic impedances include the leakage impedance of the fixture and LCR meter, the impedance of the current limiting series resistor, output impedances of voltage sources, and series impedances of cables. The measurements of a device under test and the measurement of the parasitic impedances are separated in time. The parasitic impedances are measured during calibration and can be saved to onboard memory. The LCR meter can automatically use the associated parasitic impedances if it can recognize the used fixture, or the user can choose such data manually from previously stored values. The calibration of the parasitic impedances may be combined with standard open/short calibration (compensation).

The knowledge of the leakage impedance and the series impedances decreases the DUT measurement time. First, calculate a moderate accuracy value of DUT without balancing and use it for the fast-balancing method. Second, use the value of leakage impedance to compensate for a leakage current caused by residual unbalanced voltage.

For moderate requirements to accuracy, on low and medium frequencies, the leakage impedance is relatively high; balancing even in one step takes some time, and balancing may even be missed. Only moderate accuracy measurement with leakage compensation may be done. But the balancing is necessary for high accuracy measurements and at high frequencies with typical cable capacitance of about 100 pF/m and range resistor multiplexer's capacitance up to a few hundred picofarads.

Figure 8:
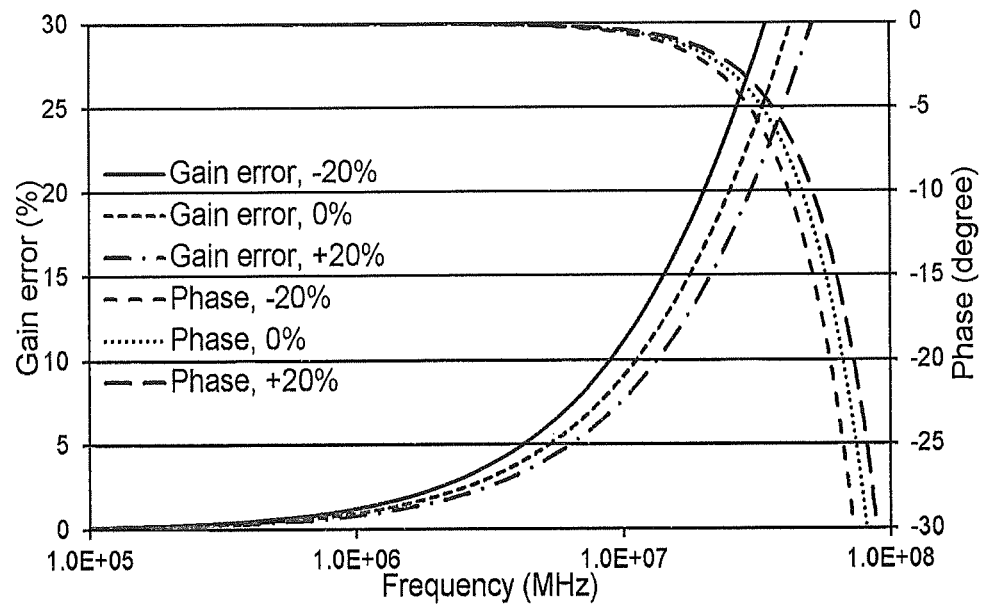
FIG. 8 shows the gain and phase errors for input buffers built on operational amplifiers with unity-gain bandwidth of about 100 MHz and frequency tolerance of ±20%.

Another cause of errors on high frequencies is inequality of gains and phase delays of operational amplifiers used in input buffers 9016, 9018, 9020, and 9022. FIG. 8 shows possible inequality of gain errors and phase delays for operational amplifiers with a unity gain of about 100 MHz and tolerance ±20% used as input buffers. Even for a relatively low signal frequency of 1 MHz, the gain error between two channels may reach ±0.4% and the gain error between DUT and range voltages ±0.8%. For precision LCR meters, it is not acceptable.

More details will be explained in the embodiments' descriptions. These embodiments are described only for explanation purposes and don't limit the present invention.

First Embodiment

The first embodiment (FIG. 9) includes a processor 9048, which provides digital signals 9042 and 9046 to the first 1002 and the second 1022 voltage sources. These voltage sources include digital-to-analog converters (DAC) 9036 and 9040, low pass filters 9028 and 9034, and output buffers 9024 and 9026. The processor also receives digital signal 9044 from an analog-to-digital converter (ADC) 9038 and controls an analog multiplexer 9030.

The output of the first voltage source 1002 through its output impedance 3002 (FIG. 3), is connected to the HC terminal and the DUT 1008. The output impedance 3002 includes output impedance 3006 of the buffer 9024 (FIG. 9), series resistor 3004, wire impedance 3008, and capacitance of cable 3010 between the HC terminal 1004 of the LCR meter and the DUT 1008.

One side of the DUT 1008, connected to HC terminal 1004, is also connected to HP terminal 1006. Another side of the DUT 1008 is connected to LP terminal 1010 and LC terminal 1016.

The output of the second voltage source 1022 through its output impedance 3018, is connected to the second terminal of the range resistor 1018. The first terminal of the range resistor is connected to the DUT 1008 through the LC terminal 1016 and the cable between the LC terminal and the DUT 1008. The output impedance 3018 of the second voltage source 1022 includes (FIG. 3) output impedance 3020 of the buffer 9026, an impedance of the range resistor multiplexer 3016, and capacitance of multiplexer 3014.

The HP terminal 1006 is connected to the normally closed input of switch 9004, the output of which is connected to the input buffer 9016. The LP terminal 1010 is connected to the normally closed input of switch 9006, the output of which is connected to input buffer 9018. The LC terminal 1016 is connected to the normally closed input of switch 9008, the output of which is connected to the input buffer 9020. The second terminal of the range resistor 1018, opposite the LC terminal, is connected to the normally closed input of switch 9010, the output of which is connected to the input buffer 9022. Outputs of the input buffers 9016, 9018, 9020, and 9022 are connected to inputs of multiplexer 9030, the output of which, through buffer 9032, is connected to the ADC 9038. Normally open inputs of switches 9004, 9006, 9008, and 9010 are connected to the output of switch 9012. The normally closed input of switch 9012 is connected to the ground, and the normally open input is connected to the output of the second voltage source 1022.

Operation of the First Embodiment

Figure 9:
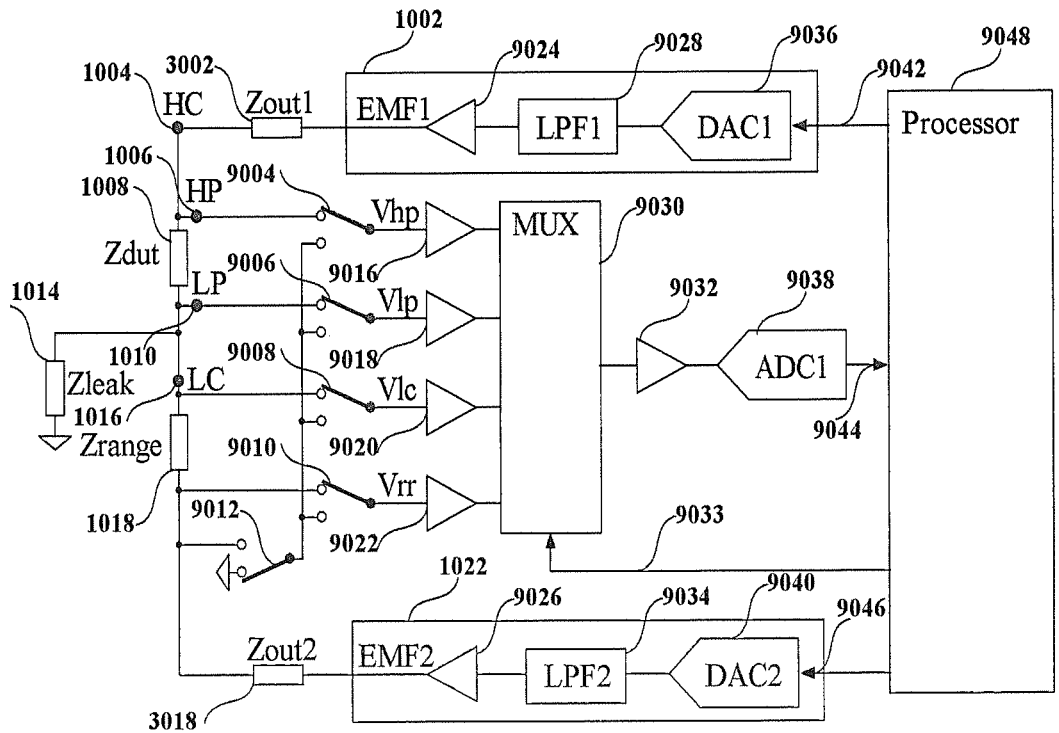
FIG. 9 shows a block diagram of the first embodiment of the present invention.

The leakage impedance measurement, the measurement of series impedances, and the equalization of the input buffers are performed during open/short calibration in the first embodiment (FIG. 9).

The first embodiment may also use the guard to decrease voltage between the middle point and the cable's shield. In this case, all equations are the same; the only difference is that the leakage impedance is higher.

Leakage Calibration and Compensation

Figure 2:
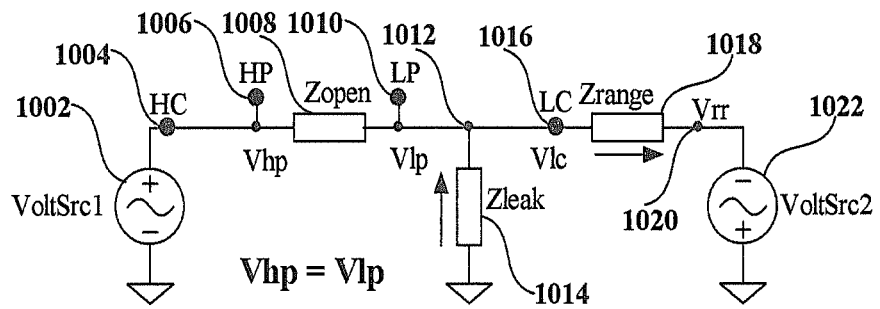
FIG. 2 shows a method of leakage impedance measurement.

FIG. 2 shows a method of measurement of the leakage impedance. The leakage impedance is measured and calculated by setting the open state of the fixture by removing a DUT and applying a predetermined voltage through a predetermined range resistor, measuring the voltages across the leakage impedance and the range resistor, eliminating the influence of the open DUT by setting the same voltage on the HP terminal as on LP terminal and adjusting it in a predetermined number of iterations to get the closest values of these voltages to eliminate current through an open DUT. To set necessary voltages on the HP terminal, use the method in equations 33 and 34.

$$Zleak = \frac{Vlp * Zrange}{Vlc - Vrr} \quad \text{The leakage impedance} \quad (1)$$

All values are complex.

While measuring the parameters of a DUT, the leakage impedance is used to calculate a leakage current and compensate for its influence by subtracting a current value from a current through the range resistor.

Calibration of Series Impedances

Figure 3:
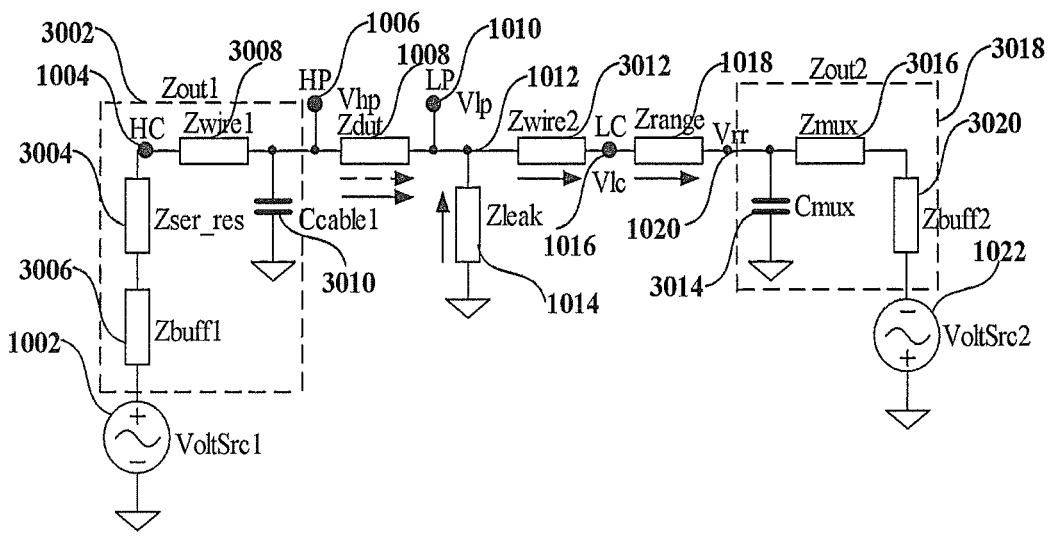
FIG. 3 shows parasitic impedances necessary for the fast-balancing method.

FIG. 3 shows a method of measurement of the series impedances, including the output impedances of the first 3002 and second 3018 voltage sources and the impedance of the wire between the DUT and the LC terminal 3012. The impedance of cable wire 3012 between the DUT and the LC terminal and the output impedances of both voltage sources are necessary for setting close to zero balancing voltage. Both open and short states of measurement circuitry are required to measure and calculate the series impedances. Both sets of all measured voltages, open and short, are saved and used to calculate the series impedances in the calibration process.

$$dI1 = \frac{Vlc_{short} - Vrr_{short}}{Zrange} + \frac{Vlp_{short}}{Zleak} \quad \text{A current change of the first voltage source} \quad (2)$$

$$dI2 = \frac{Vlc_{short} - Vrr_{short}}{Zrange} - \frac{Vrr_{open}}{Zleak + Zrange} \quad \text{A current change of the second voltage source} \quad (3)$$

$$Zout1 = \frac{Vhp_{open} - Vhp_{short}}{dI1} \quad \text{The output impedance of the first voltage source} \quad (4)$$

$$Zout2 = \frac{Vrr_{open} - Vrr_{short}}{dI1} \quad \text{The output impedance of the second voltage source} \quad (5)$$

$$Zwire2 = \frac{Vlp_{open} - Vlc_{short}}{dI2} \quad \text{The impedance of the wire between the DUT and the LC terminal} \quad (6)$$

All values are complex.

Equalization Method

The first embodiment (FIG. 9) can do an equalization calibration to eliminate gain and phase inequality of the input buffers automatically without user participation. The structure of the first embodiment with independently measured voltages on input terminals and the range resistor relative to the ground allows the equalization calibration by simultaneously providing the same predetermined voltage to all input buffers. FIG. 9 shows the initial normally closed position of the switches 9004, 9006, 9008, 9010, and 9012. For the equalization, calibration needs to set the opposite position of these switches, connecting the input buffers to the common point with common for all channels voltage. After that, we need to apply a predetermined voltage from the second voltage source, measure voltages on input buffers or voltage channels and calculate and save correction coefficients. One of the input channels needs to assign as a reference, for example, the LP channel.

$$Chp = \frac{Vlp}{Vhp} \quad \text{A correction coefficient for the high potential input buffer 9016} \quad (7)$$

$$Clp = \frac{Vlp}{Vlp} \quad \text{A correction coefficient for the low potential input buffer 9018} \quad (8)$$

$$Clc = \frac{Vlp}{Vlc} \quad \text{A correction coefficient for the low current input buffer 9020} \quad (9)$$

$$Crr = \frac{Vlp}{Vrr} \quad \text{A correction coefficient for the range resistor input buffer 9022} \quad (10)$$

Then, during measurement time, the corrected voltage will be $$V_{xx\_corr} = V_{xx\_raw} * C_{xx} \quad (11)$$

Low-Level Processing

Figure 4:
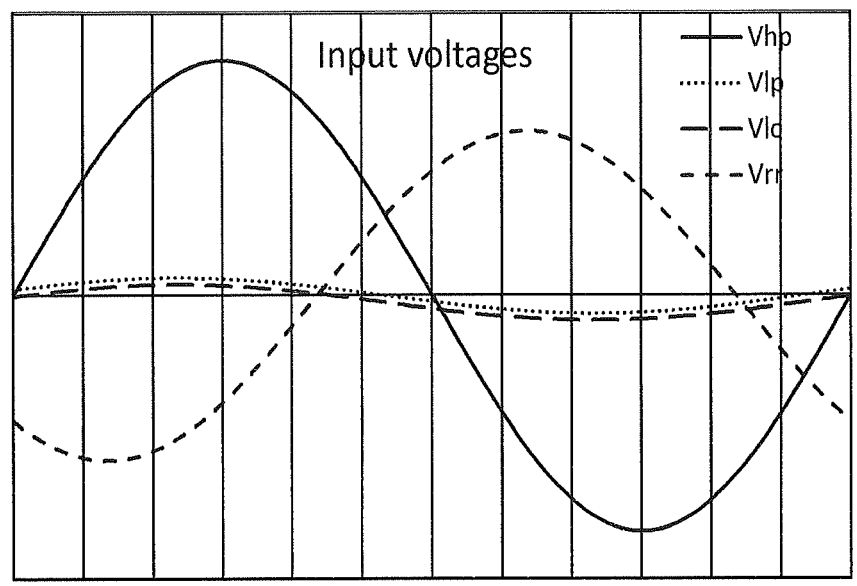
FIG. 4 shows an example of input terminals' voltages of the LCR meter for one signal period.
Figure 5:
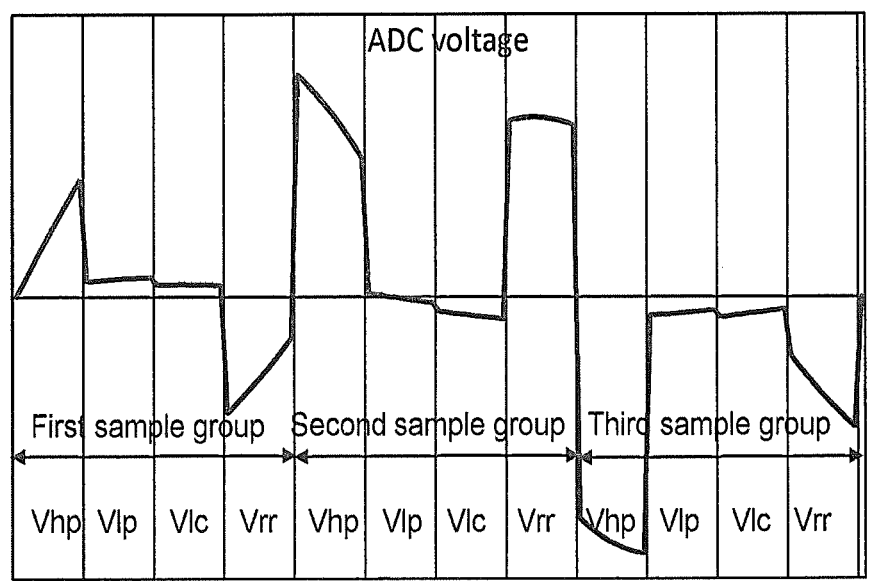
FIG. 5 shows the ADC1 input voltages for the first embodiment.
Figure 6:
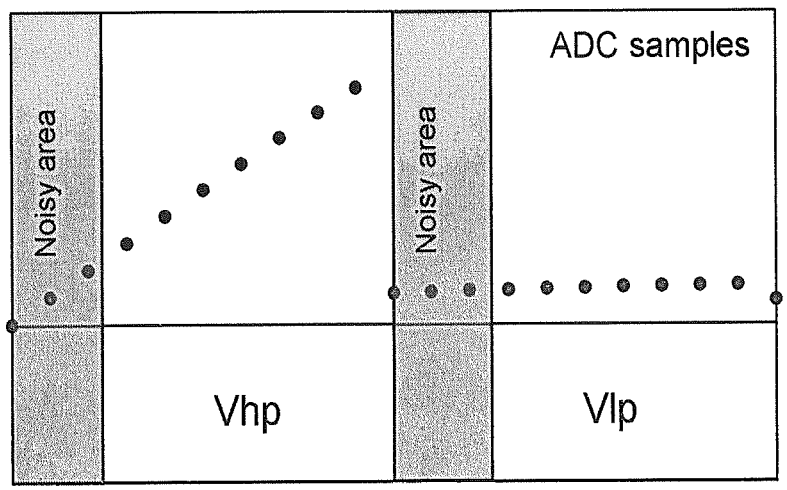
FIG. 6 shows the ADC1 input voltages for the first embodiment with more details.

For lower cost, the first embodiment uses a structure with one ADC and a four-channel multiplexer to switch voltage channels. FIG. 4 shows input voltages, and FIG. 5 shows the voltages on ADC input. Because switching multiplexer channels produces commutation noise, the noisy part of the time intervals after switching needs to exclude from ADC signal processing, FIG. 6 shows noisy and proper time intervals.

By the Nyquist theorem, the sampling frequency must be more than two times higher than the signal bandwidth. To measure vector voltage by direct Fourier transform (DFT), at least one whole period of signal frequency is necessary. So, the minimum vector voltage measurement time is limited by one period of signal frequency and at least three ADC samples for every measured voltage. Therefore, all voltages must be measured simultaneously (FIG. 5), and there must be at least three sample groups. Equations 12 . . . 16 describe the necessary condition for low and medium frequencies if minimum measurement time is needed.

$$Tsample = 1/Fsample \quad \text{A sample period} \quad (12)$$

$$Tsignal = 1/Fsignal \quad \text{A signal period} \quad (13)$$

$$Tbuffer = Tsample * BufferSize \quad \text{A buffer time interval} \quad (14)$$

$$Tsamplegroup = Tbuffer * Nchannels \quad \text{A sample group interval} \quad (15)$$

$$Tmeas_{Minimum \atop (M \geq 3)} = \quad \text{A minimum measurement time} \quad (16)$$
$$Tsignal = M * Tsamplegroup$$

The BufferSize, the Nchannels, and the M are integer numbers. The BufferSize is the size of direct memory access (DMA) buffers, Nchannels is the number of voltage channels, and the M is the number of sample groups.

Figure 11:
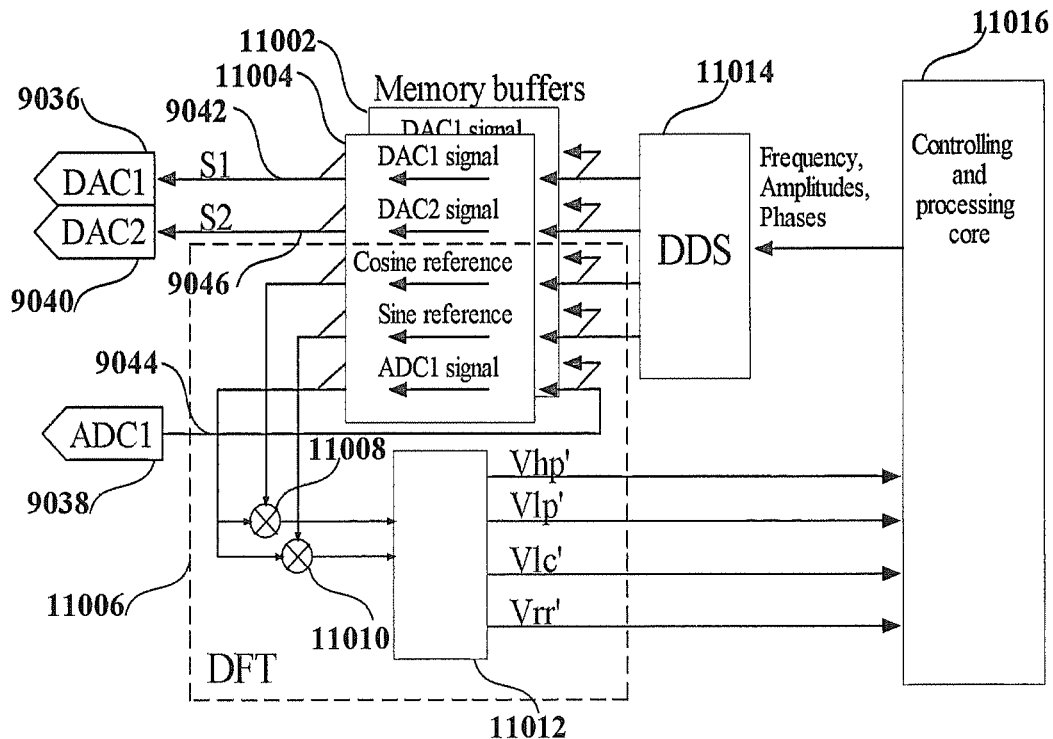
FIG. 11 shows a block diagram of low-level processing for the first embodiment.

FIG. 11 shows the first embodiment's signal processing with more details. Processor 9048 includes low-level processing of instant digital values of input and output voltages and high-level processing of digital representations of these voltages to calculate results in controlling and processing core 11016.

Low-level processing includes direct digital synthesizer 11014, first 11002 and second 11004 sets of memory buffers to store samples of input and output voltages, references' values, multipliers for DFT 11008 and 11010, demultiplexer and accumulators 11012 to separate input voltage samples from different voltage channels and accumulate them in DFT process, interfaces to transfer digital signals S1 and S2 to DACs 9042, 9046 and interface to transfer digital signal from the ADC 9038 to memory 11002 and 11004. To speed up the processing, DMA is used to transfer data from memory to DACs 9036 and 9040 and from ADC 9038 to memory 11002 and 11004.

Figure 12:
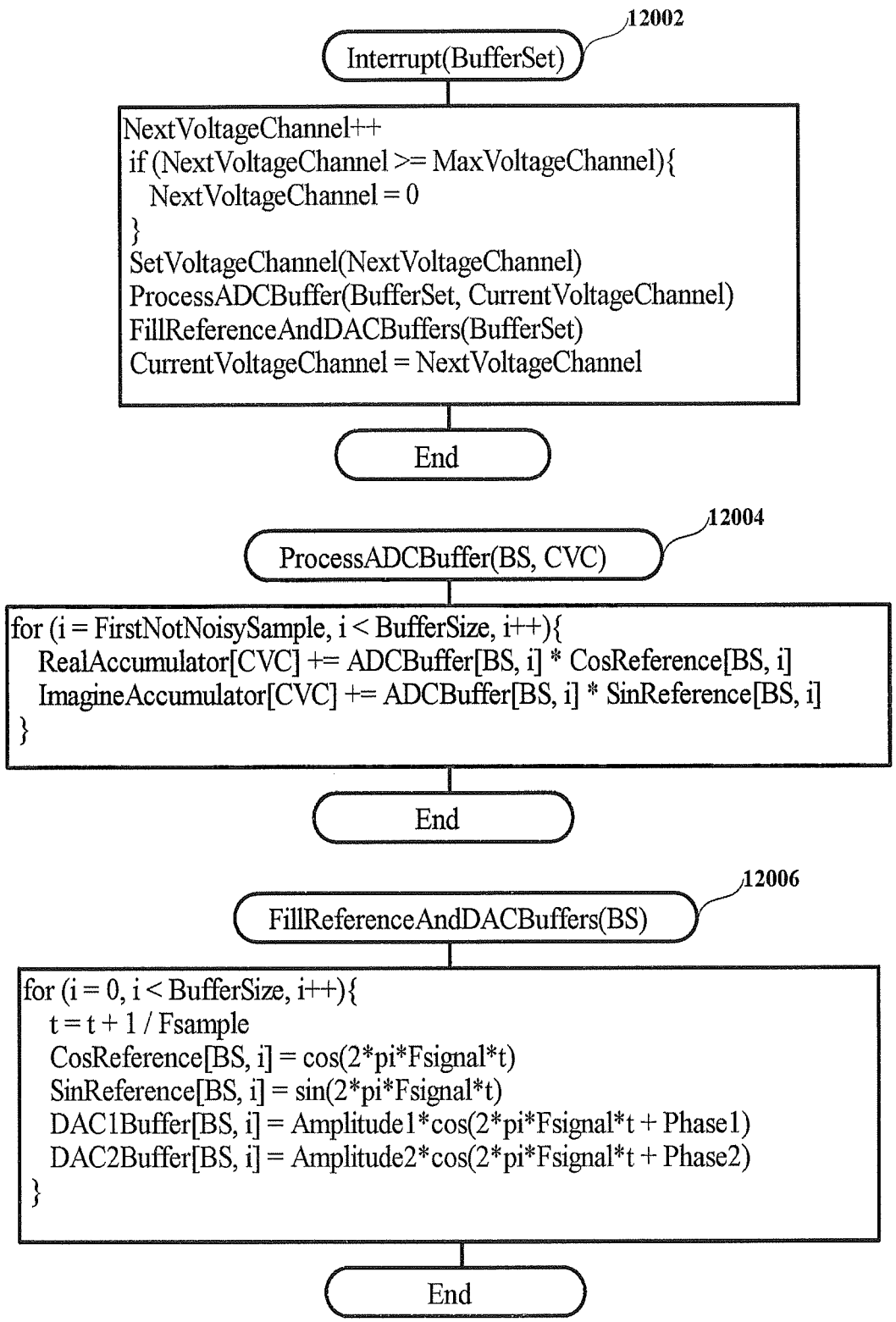
FIG. 12 shows a flowchart of the low-level work process of the processor.

Flowcharts in FIG. 12 show data processing flow. First, data from ADC and reference data already filled in the previous DMA cycle are processed. These data are used for DFT. Second, data for the next DMA cycle are prepared. These data will be used for DACs and the DFT. The reference data are filled together with the DACs data to save time during the DFT processing. The procedure "SetVoltageChannel()" switches multiplexer 9030 to the next channel.

This processing is described for implementation in a processor, but it may also be implemented in microcontrollers, DSPs, FPGAs, ASICs, and other hardware.

Fast-Balancing Method

For balancing, the first embodiment uses the fast-balancing method. If the leakage impedance is already known from earlier calibration, balancing conditions may be calculated after only one measurement of voltages. But the known leakage impedance has limited accuracy because some minor changes in cables to fixture geometry are possible, and as a result, cables' capacitance can change. Also, the leakage impedance depends on the ambient temperature. So, the first calculation of the DUT impedance without balancing will have moderate accuracy. It will be used to reach balancing and calculate the DUT impedance after balancing, and even more, advanced accuracy may be achieved by applying the leakage compensation method. Equations 17 . . . 34 show how to calculate balancing conditions.

Voltages and currents before balancing:

$$Irange = \frac{Vlc - Vrr}{Zrange} \quad \text{Current through the range resistor} \quad (17)$$

$$Ileak = \frac{-Vlp}{Zleak} \quad \text{Current through the leakage impedance} \quad (18)$$

$$Idut = Irange + Ileak \quad \text{Current through the DUT} \quad (19)$$

$$Zdut = \frac{Vhp - Vlp}{Idut} \quad \text{The rough impedance of the DUT} \quad (20)$$

$$EMF1 = Vhp + Idut * Zdout1 \quad \text{Electro moving force (EMF)} \quad (21)$$
$$\text{of the first voltage source}$$

$$EMF2 = Vrr - Irange * Zout2 \quad \text{EMF of the second voltage source} \quad (22)$$

Balance conditions for the first voltage source as not adjusted voltage and the second voltage source as adjusted voltage (LCR is in constant voltage mode):

$$Vlp = 0 \quad \text{Balance condition} \quad (23)$$

$$Idut_{New} = \frac{EMF1}{Zdut + Zout1} \quad \text{New current through the DUT} \quad (24)$$

$$Irange_{New} = Idut_{New} \quad \text{New current through the range resistor} \quad (25)$$

$$EMF2_{New} = Irange_{New} * \quad \text{New EMF of the} \quad (26)$$
$$(Zwire2 + Zrange + Zout2) \quad \text{second voltage source}$$

$$CorrCoeff = \frac{EMF2_{New}}{EMF2} \quad \text{Correcting coefficient for} \quad (27)$$
$$\text{EMF of the second voltage source}$$

$$S2_{New} = CorrCoeff * S2 \quad \text{The new value of the digital} \quad (28)$$
$$\text{signal for the second voltage source}$$

Balance conditions for the second voltage source as not adjusted voltage and the first voltage source as adjusted voltage (LCR is in constant current mode):

$$Vlp = 0 \quad \text{Balance condition} \quad (29)$$

$$Irange_{New} = \quad \text{New current} \quad (30)$$
$$\frac{-EMF2}{Zwire2 + Zrange + Zout2} \quad \text{through the range resistor}$$

$$Idut_{New} = Irange_{New} \quad \text{New current through the DUT} \quad (31)$$

$$EMF1_{New} = \quad \text{New EMF of} \quad (32)$$
$$Idut_{New} * (Zdut + Zout1) \quad \text{the first voltage source}$$

-continued $$CorrCoeff = \frac{EMF1_{New}}{EMF1} \quad \text{Correcting coefficient for} \quad (33)$$
$$\text{EMF of the first voltage source}$$

$$S1_{New} = CorrCoeff * S1 \quad \text{The new value of the digital} \quad (34)$$
$$\text{signal for the first voltage source}$$

All values are complex.

Figure 7:
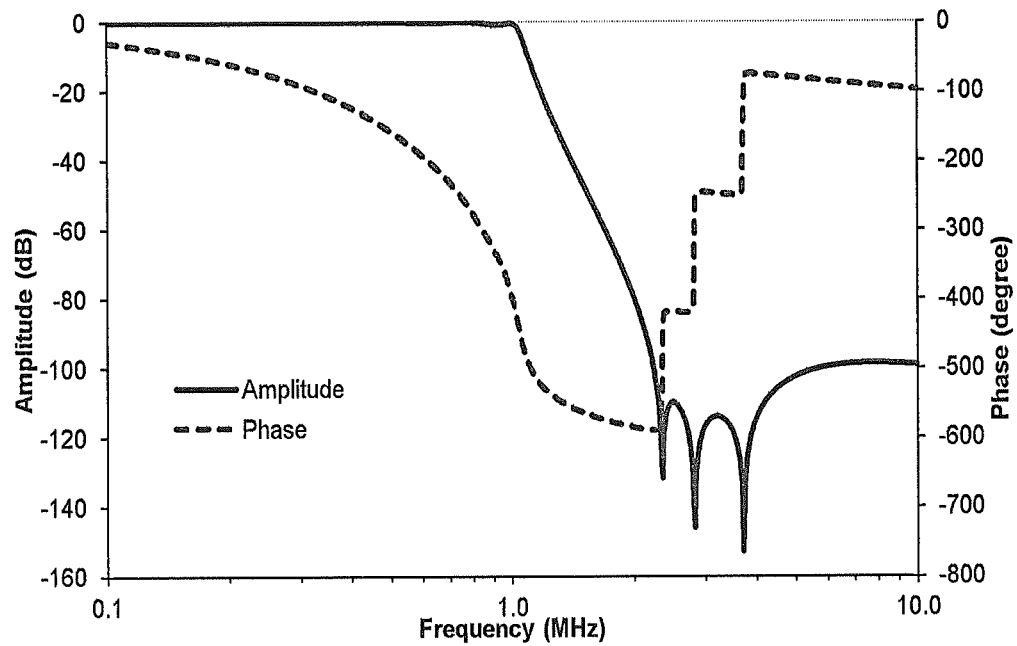
FIG. 7 shows a low-pass anti-aliasing filter's gain and phase frequency response.

Calculating correcting coefficient (CorrCoeff) as the relation between new and old EMFs is the implicit replacement of the explicit calculation of low-pass filter (LPF) frequency response. FIG. 7 shows an example of high-order anti-aliasing LPF amplitude and phase frequency responses for an LCR meter with a maximal signal frequency of 1 MHz and sample frequency of 3 Msps. The calculation of the CorrCoeff allows excluding the necessity of calibration of the LPFs with very steep slopes at high frequencies.

After setting balance conditions, the controlling and processing unit must wait for voltage settling and start measurement with balanced conditions. After accurate measuring with the balanced conditions of the voltages, repeat the calculation of the parameters of DUT by using equations 17 . . . 20.

First Embodiment Advantages

At least two times less time of balancing in comparison against any other methods, excluding trans-impedance amplifier and guard.

Single ADC gives low cost in production.

Channels' equalization allows using signals with higher frequencies at a lower cost.

Digital design gives flexibility and low cost.

First Embodiment Disadvantages

For measurement of three-terminal capacitors, either more than one balancing cycle is needed or special calibration, like leakage calibration for each three-terminal capacitor individually (FIG. 2), because they have some input capacitance to the ground, which was not included in the saved leakage impedance.

Second Embodiment

Figure 10:
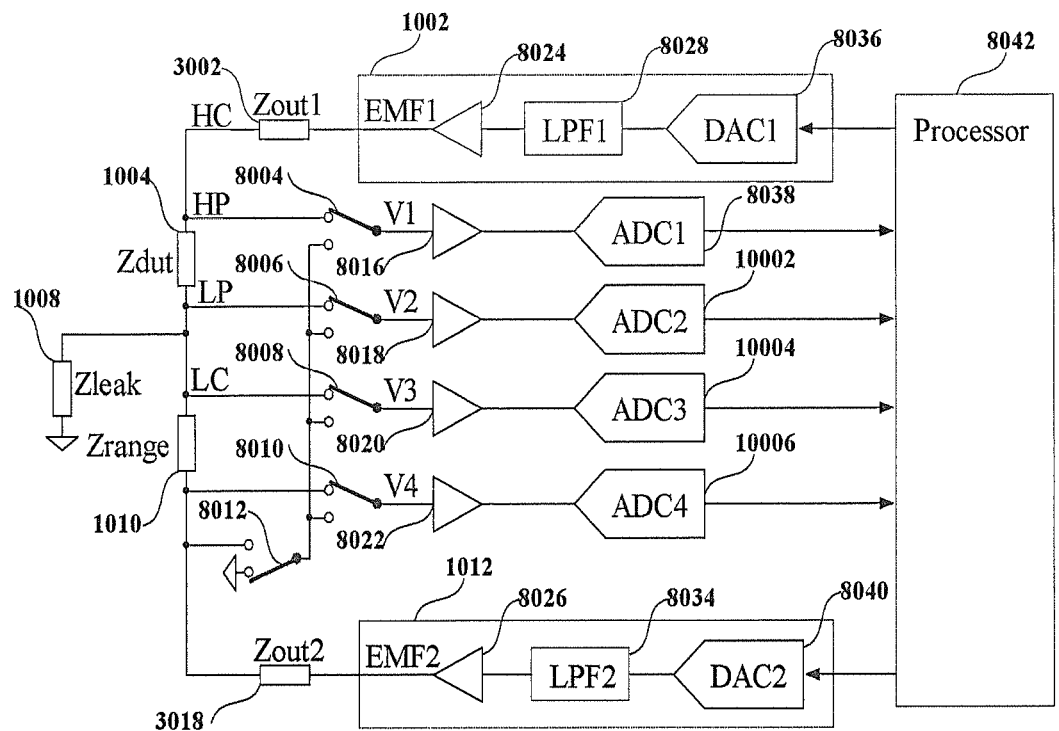
FIG. 10 shows a block diagram of the second embodiment of the present invention.

The second embodiment (FIG. 10), unlike the first embodiment, includes four parallel channels of voltage measurement without multiplexing with additional ADCs 10002, 10004, and 10006 and additional digital signals 10008, 10010, and 10012 to speed up measurements on high frequencies. The second embodiment uses the fast-balancing method as the first embodiment and works similarly.

The advantage of the second embodiment is increasing the signal-to-noise ratio and speeding up measurements.

What is claimed is:

1. A fast-balancing method of impedance measuring with leakage impedance compensation comprising:
   providing an LCR meter having:
   a high current (HC) terminal,
   a high potential (HP) terminal,
   a low potential (LP) terminal,
   a low current (LC) terminal,
   a fixture for connecting to a device under test (DUT),
   a set of reference resistors with first and second terminals, said first terminal being connected to said LC terminal,
   a first voltage source comprising an output, said output of said first voltage source being connected to said HC terminal,
   a second voltage source comprising an output, said output of said second voltage source being connected to the second terminal of said set of reference resistors,
   a processor comprising a memory, said processor being capable of measuring voltages on said HP terminal, said LP terminal, said LC terminal, said second terminal of said set of reference resistors, and said output of said second voltage source;
   attaching said fixture to said HC, HP, LP, and LC terminals;
   setting an impedance of said set of reference resistors to a first predetermined value;
   setting said output of said first voltage source to a first predetermined voltage;
   setting said output of said second voltage source to a second predetermined voltage on the output of said second voltage source;
   measuring a first measurement of a leakage impedance of said fixture and said LCR meter;
   saving said first measurement to said memory of said processor;
   setting impedance of said set of reference resistors to a second predetermined value;
   measuring second measurements of series impedances for said fixture, said first voltage source, and said second voltage source;
   saving said second measurements to said memory of said processor;
   attaching a DUT to said fixture;
   setting impedance of said set of reference resistors to a third predetermined value;
   setting said output of said first voltage source to a third predetermined voltage on the output of said first voltage source;
   setting said output of said second voltage source to a fourth predetermined voltage;
   measuring third measurements of voltages at said HP terminal, said LP terminal, said LC terminal, and said second terminal of said set of reference resistors;
   calculating the impedance value of said DUT using said first measurement;
   calculating specific voltages that, when applied to said outputs of said first and second voltage sources, would yield a zero voltage at said LP terminal by using said second measurements;
   setting said outputs of said first and second voltage sources to said specific voltages;
   measuring fourth measurements of voltages at said HP terminal, said LP terminal, said LC terminal, and said second terminal of said set of reference resistors; and
   calculating an impedance value of said DUT with said zero voltage at said LP terminal using said fourth measurements.

* * * * *